(12) United States Patent
Su et al.

(10) Patent No.: US 10,401,388 B2
(45) Date of Patent: Sep. 3, 2019

(54) PROBE CARD DEVICE AND RECTANGULAR PROBE THEREOF

(71) Applicant: CHUNGHWA PRECISION TEST TECH. CO., LTD., Taoyuan (TW)

(72) Inventors: Wei-Jhih Su, Taichung (TW); Chih-Peng Hsieh, Taipei (TW)

(73) Assignee: CHUNGHWA PRECISION TEST TECH. CO., LTD., Taoyuan (TW)

(*) Notice: Subject to any disclaimer, the term of this patent is extended or adjusted under 35 U.S.C. 154(b) by 177 days.

(21) Appl. No.: 15/810,220

(22) Filed: Nov. 13, 2017

(65) Prior Publication Data

US 2019/0072584 A1    Mar. 7, 2019

(30) Foreign Application Priority Data

Sep. 4, 2017 (TW) .............................. 106130163 A

(51) Int. Cl.
*G01R 1/073* (2006.01)
*G01R 1/067* (2006.01)
*G01R 1/04* (2006.01)

(52) U.S. Cl.
CPC ..... *G01R 1/07328* (2013.01); *G01R 1/06733* (2013.01); *G01R 1/06755* (2013.01); *G01R 1/07378* (2013.01)

(58) Field of Classification Search
CPC ............ G01R 1/07342; G01R 1/07314; G01R 1/06716
See application file for complete search history.

(56) References Cited

U.S. PATENT DOCUMENTS

| | | | |
|---|---|---|---|
| 2008/0164892 A1* | 7/2008 | Takekoshi .......... | G01R 1/06727 324/754.11 |
| 2009/0144971 A1* | 6/2009 | Takekoshi .......... | G01R 1/06722 29/846 |
| 2011/0089962 A1* | 4/2011 | Pagani ..................... | G01R 1/07 324/754.03 |
| 2012/0319711 A1* | 12/2012 | Hung ................. | G01R 1/07371 324/750.16 |
| 2013/0265074 A1* | 10/2013 | Sato .................... | G01R 1/06711 324/755.01 |
| 2014/0210505 A1* | 7/2014 | Chen .................... | G01R 1/0735 324/756.03 |

* cited by examiner

*Primary Examiner* — Alesa Allgood
(74) *Attorney, Agent, or Firm* — Li & Cai Intellectual Property (USA) Office

(57) ABSTRACT

A rectangular probe of a probe card device includes a metallic pin and a metallic reinforcing body. The metallic pin includes a middle segment, a first connecting segment and a second connecting segment respectively extending from two opposite ends of the middle segment, a first contacting segment extending from the first connecting segment in a direction away from the middle segment, and a second contacting segment extending from the second connecting segment in a direction away from the middle segment. The metallic reinforcing body is integrally formed on the middle segment. The Young's modulus of the metallic reinforcing body is larger than that of the metallic pin. The electric conductivity of the metallic pin is larger than that of the metallic reinforcing body. An outside diameter jointly formed by the metallic reinforcing body and the middle segment is larger than an outside diameter of the second connecting segment.

10 Claims, 7 Drawing Sheets

PROBE CARD DEVICE AND RECTANGULAR PROBE THEREOF

BACKGROUND OF THE INVENTION

1. Field of the Invention

The present disclosure relates to a probe card; in particular, to a probe card device and a rectangular probe thereof.

2. Description of Related Art

In a testing process of semi-conductor wafer, a testing apparatus is electrically connected to an object to be tested by using a probe card device, and the testing apparatus can obtain a testing result of the object to be tested by signal transmission and signal analysis. The conventional probe card device has a plurality of probes corresponding in position to electrical pads of the testing result, and the probes are used to simultaneously and respectively contact the electrical pads of the testing result.

Specifically, the probes of the conventional probe card device can be rectangular probes, which can be made by using a microelectromechanical systems (MEMS) technology to form a determined shape according to designer demands. However, the conventional rectangular probe is made of a single material, so that the conventional rectangular probe cannot be formed with a better current conduction property and a better mechanical strength property at the same time.

SUMMARY OF THE INVENTION

The present disclosure provides a probe card device and a rectangular probe thereof to effectively improve the drawbacks associated with conventional rectangular probes.

The present disclosure discloses a probe card device, which includes an upper die, a lower die, and a plurality of rectangular probes. The upper die has a plurality of first thru-holes. Each of the first thru-holes has a first aperture. The lower die has a plurality of second thru-holes and is substantially parallel to the upper die. The second thru-holes are respectively corresponding in position to the first thru-holes, and each of the second thru-holes has a second aperture smaller than the first aperture. Each of the rectangular probes includes a metallic pin and a metallic reinforcing body integrally formed on the metallic pin. In each of the rectangular probes, a Young's modulus of the metallic reinforcing body is larger than that of the metallic pin, and electric conductivity of the metallic pin is larger than that of the metallic reinforcing body. The metallic pin of each of the rectangular probes includes a middle segment, a first connecting segment, a second connecting segment, a second connecting segment, and a first contacting segment. The middle segment is arranged between the upper die and the lower die. The first connecting segment extends from an end of the middle segment and is arranged in the corresponding first thru-hole. The second connecting segment extends from the other end of the middle segment and is arranged in the corresponding second thru-hole. The first contacting segment extends from the first connecting segment and is arranged outside the corresponding first thru-hole. The second contacting segment extends from the second connecting segment and is arranged outside the corresponding second thru-hole. In each of the rectangular probes, the metallic reinforcing body is integrally formed on the middle segment of the metallic pin, and an outside diameter jointly formed by the metallic reinforcing body and the middle segment is larger than the second aperture and smaller than the first aperture.

The present disclosure also discloses a rectangular probe of a probe card device, which includes a metallic pin and a metallic reinforcing body. The metallic pin includes a middle segment, a first connecting segment, a second connecting segment, a first contacting segment, and a second contacting segment. The first connecting segment and the second connecting segment respectively extend from two opposite ends of the middle segment. The first contacting segment extends from the first connecting segment in a direction away from the middle segment. The second contacting segment extends from the second connecting segment in a direction away from the middle segment. The metallic reinforcing body is integrally formed on the middle segment of the metallic pin. A Young's modulus of the metallic reinforcing body is larger than that of the metallic pin, electric conductivity of the metallic pin is larger than that of the metallic reinforcing body, and an outside diameter jointly formed by the metallic reinforcing body and the middle segment is larger than an outside diameter of the second connecting segment.

In summary, the structure of the rectangular probe (i.e., the metallic reinforcing body is integrally formed on the middle segment of the metallic pin) is formed without affecting the current conduction property and can effectively improve the mechanical strength of the metallic pin.

Moreover, when the rectangular probe is inserted into the upper die and the lower die, the outside diameter jointly formed by the metallic reinforcing body and the middle segment is larger than the second aperture, thereby preventing the rectangular probe from falling outside the range of the probe head through the second thru-hole.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

Reference is made to FIGS. 1 to 4D, which illustrate the present disclosure. References are hereunder made to the detailed descriptions and appended drawings in connection with the present disclosure. However, the appended drawings are merely provided for exemplary purposes, and should not be construed as restricting the scope of the present disclosure.

Figure 1:
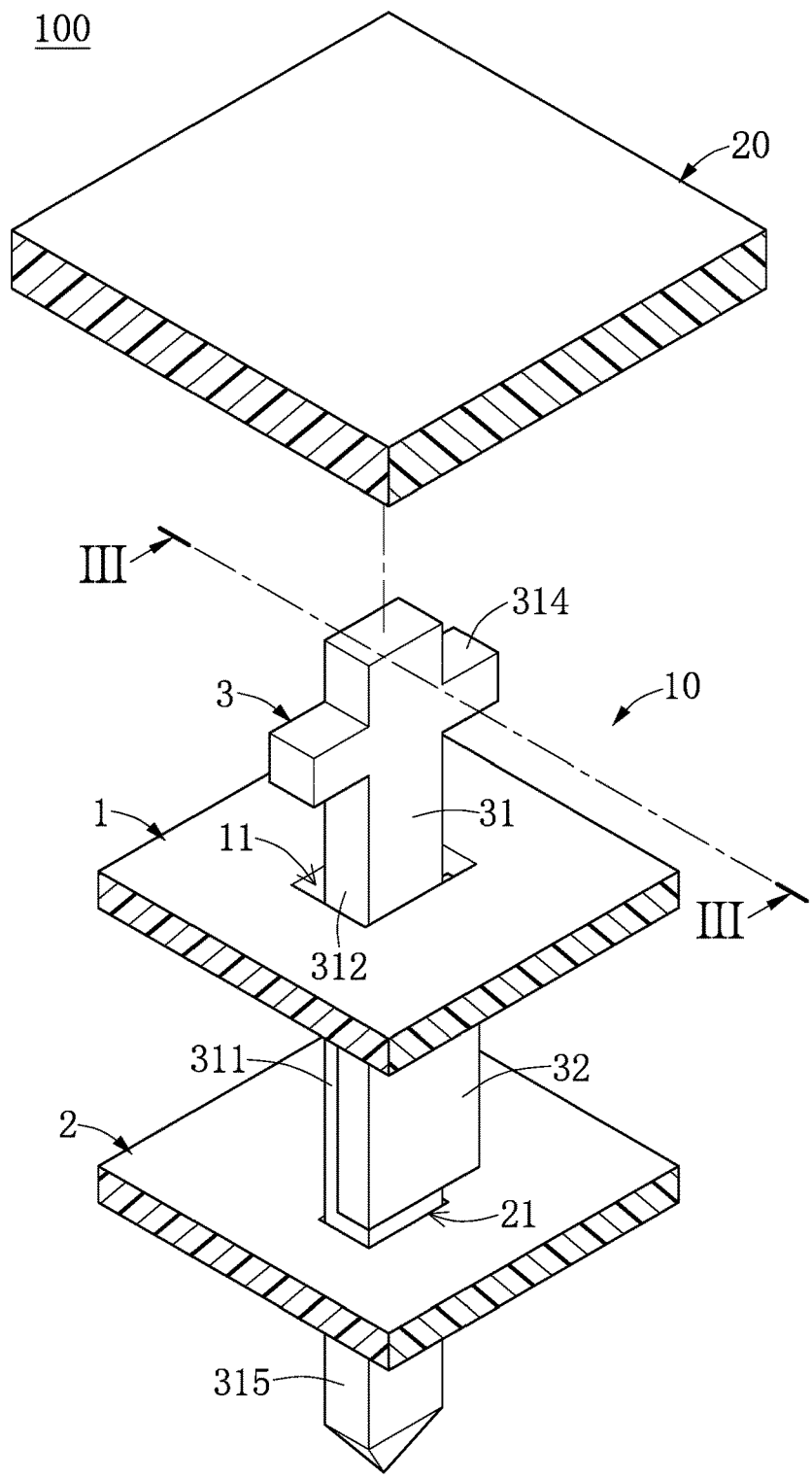
FIG. 1 is a perspective view showing a probe card device according to an embodiment of the present disclosure.
Figure 2:
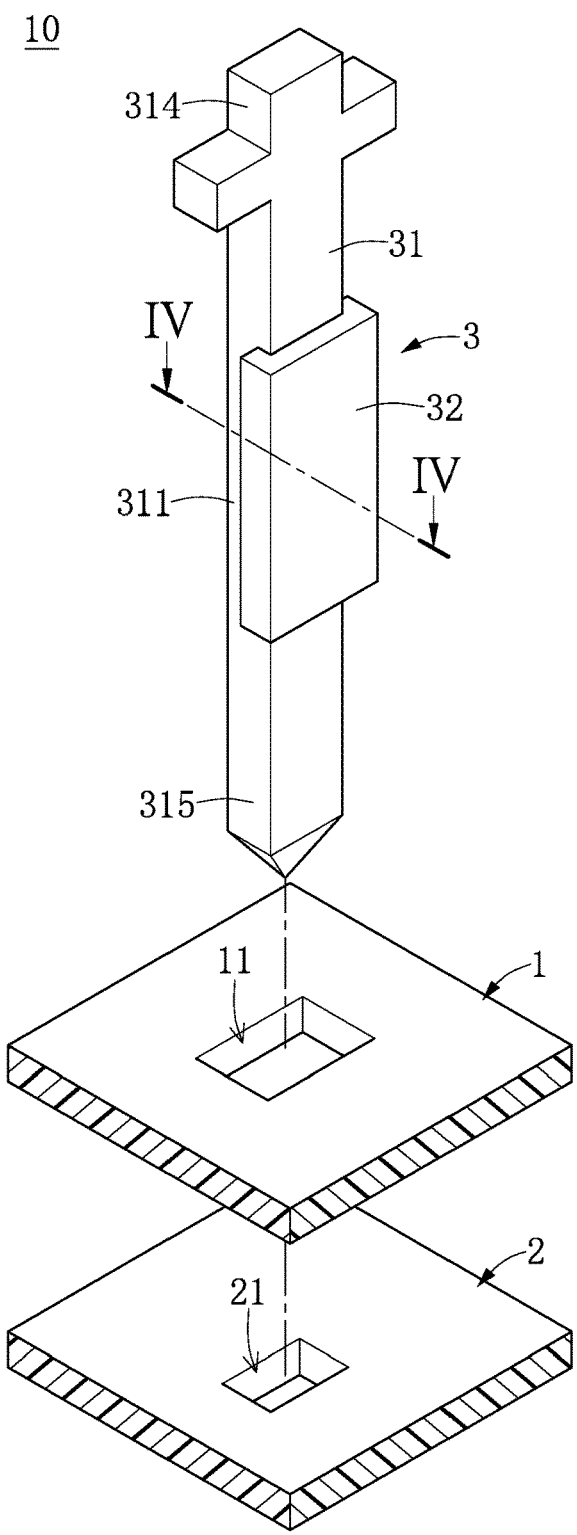
FIG. 2 is an exploded view of FIG. 1 in which a space transformer is omitted.

Reference is first made to FIGS. 1 to 3A, which illustrate an embodiment of the present disclosure. The present embodiment discloses a probe card device 100. The probe card device 100 includes a probe head 10 and a space transformer 20 abutted against one side of the probe head 10 (i.e., the top side of the probe head 1 as shown in FIG. 1), and the other side of the probe head 10 (i.e., the bottom side of the probe head 1 as shown in FIG. 1) can be used for testing an object to be tested, such as a semi-conductor wafer (not shown).

In order to easily express the present embodiment, the figures only show a part of the probe card device 100 for clearly showing the structure and connection of each component of the probe card device 100. The following description discloses the structure and connection of each component of the probe card device 100.

The probe head 10 includes an upper die 1, a lower die 2 substantially parallel to the upper die 1, a spacer (not shown) sandwiched between the upper die 1 and the lower die 2, and a plurality of rectangular probes 3. The upper die 1 has a plurality of first thru-holes 11, and each of the first thru-holes 11 has a first aperture D11. The lower die 2 has a plurality of second thru-holes 21 respectively corresponding in position to the first thru-holes 11, and each of the second thru-holes 21 has a second aperture D21 smaller than the first aperture D11.

Moreover, the rectangular probes 3 are substantially in a matrix arrangement. Each of the rectangular probes 3 sequentially passes through the corresponding first thru-hole 11 of the upper die 1, the spacer, and the corresponding second thru-hole 21 of the lower die 2. The present embodiment does not disclose the detailed structure of the spacer.

Specifically, the rectangular probe 3 in the present embodiment is cooperated with the upper die 1, the spacer, and the lower die 2, but the practical application of the rectangular probe 3 is not limited thereto. The probe card device 100 in the present embodiment is limited to the use of the rectangular probe 3, which can be made by using MEMS technology, so the present embodiment excludes any round probe which is made of a producing process differing from the MEMS technology. In other words, the producing process of the rectangular probe 3 is obviously different from that of any round probe, so that the round probe does not provide any motivation in producing the rectangular probe 3.

As the rectangular probes 3 are of the same structure, the following description only discloses the structure of one of the rectangular probes 3 for the sake of brevity. However, in other embodiments of the present disclosure, the rectangular probes 3 of the probe head 10 can be formed with different structures.

The rectangular probe 3 in the present embodiment is conductive and has a flexible straight structure. The rectangular probe 3 has a cross section perpendicular to a longitudinal direction thereof, and the cross section is a substantial rectangle, which includes a square. The rectangular probe 3 includes a metallic pin 31 and a metallic reinforcing body 32 integrally formed on the metallic pin 31. Specifically, a Young's modulus of the metallic reinforcing body 32 is larger than that of the metallic pin 31, so that the rectangular probe 3 can be provided with a better mechanical strength property by using the metallic reinforcing body 32. Moreover, electric conductivity of the metallic pin 31 is larger than that of the metallic reinforcing body 32, so that the rectangular probe 3 can be provided with a better current conduction property by using the metallic pin 31.

In the present embodiment, the Young's modulus of the metallic pin 31 is within a range of 40~100 Gpa, the electric conductivity of the metallic pin 31 is larger than or equal to $5.0 \times 10^{-4}$ S·m$^{-1}$, the Young's modulus of the metallic reinforcing body 32 is larger than or equal to 100 Gpa, and the electric conductivity of the metallic reinforcing body 32 is larger than or equal to $4.6 \times 10^{-4}$ S·m$^{-1}$, but the metallic pin 31 and the metallic reinforcing body 32 are not limited thereto. Moreover, the material of the metallic pin 31 or the material of the metallic reinforcing body 32 can be gold, silver, copper, nickel, cobalt, or an alloy thereof. The material of the rectangular probe 3 is preferably copper, a copper alloy, a nickel-cobalt alloy, or a palladium-nickel alloy, but the present disclosure is not limited thereto.

As shown in FIGS. 1 to 3A, the metallic pin 31 includes a middle segment 311, a first connecting segment 312 and a second connecting segment 313 respectively extending from two opposite ends of the middle segment 311, a first contacting segment 314 extending from the first connecting segment 312 in a direction away from the middle segment 311, and a second contacting segment 315 extending from the second connecting segment 313 in a direction away from the middle segment 311.

Figure 3A:
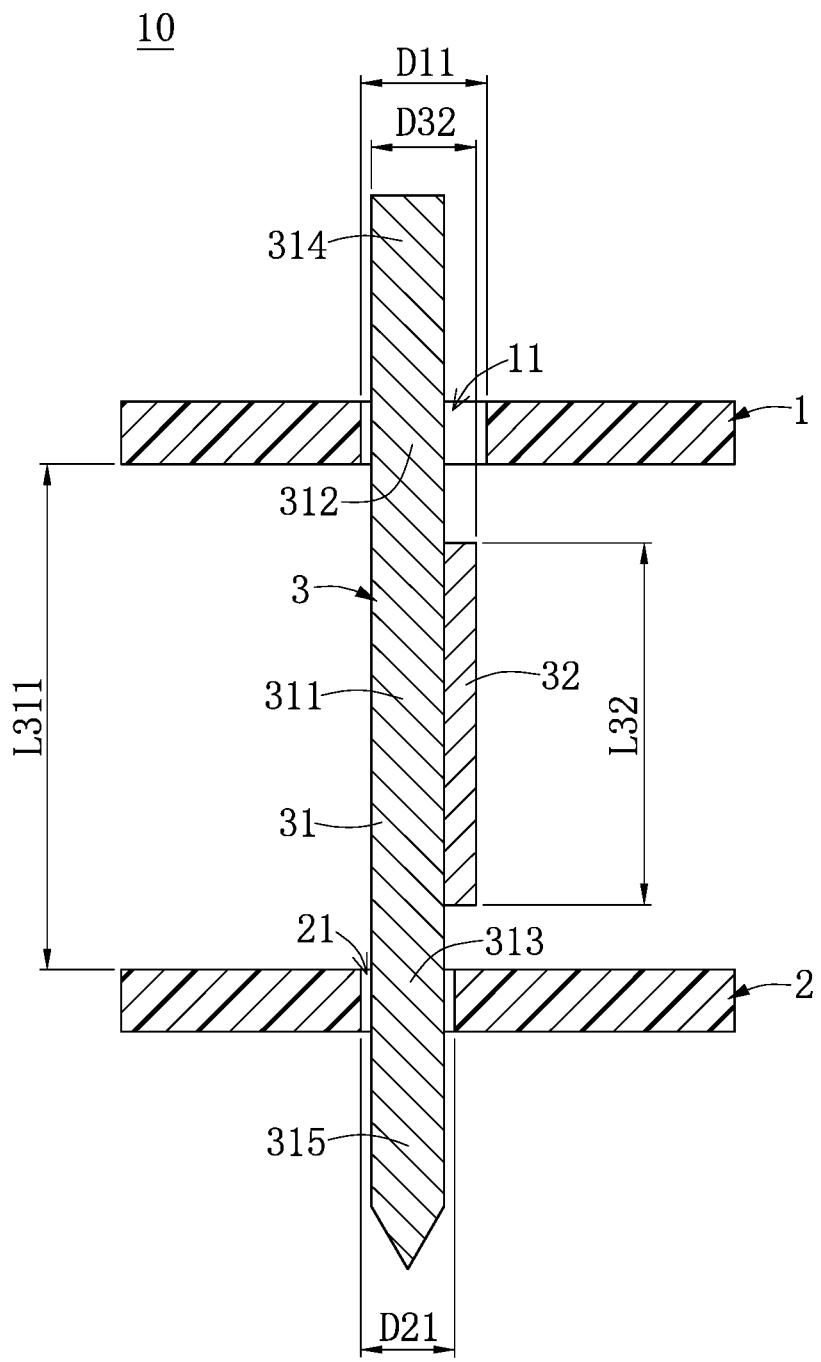
FIG. 3A is a cross-sectional view taken along a cross-sectional line III-III of FIG. 1 in which the space transformer is omitted.

In other words, in a direction from the space transformer 20 toward the object to be tested (i.e., from an upper side to a lower side as shown in FIG. 3A), the rectangular probe 3 sequentially has the first contacting segment 314, the first connecting segment 312, the middle segment 311, the second connecting segment 313, and the second contacting segment 315. The first contacting segment 314 is arranged outside the corresponding first thru-hole 11 and is connected to the corresponding pad of the space transformer 20. The first connecting segment 312 is arranged in the corresponding first thru-hole 11. The middle segment 311 is arranged between the upper die 1 and the lower die 2. The second connecting segment 313 is arranged in the corresponding second thru-hole 21. The second contacting segment 315 is arranged outside the corresponding second thru-hole 21 and is connected to the corresponding pad of the object to be tested (not shown).

The metallic reinforcing body 32 is integrally formed on the middle segment 311 of the metallic pin 31, that is to say, the metallic reinforcing body 32 is arranged between the upper die 1 and the lower die 2. Moreover, a distance between the metallic reinforcing body 32 and the lower die 2 is equal to or smaller than a distance between the metallic reinforcing body 32 and the upper die 1, and an outside diameter D32 jointly formed by the metallic reinforcing body 32 and the middle segment 311 is larger than the second aperture D21 and smaller than the first aperture D11.

Thus, the structure of the rectangular probe 3 (i.e., the metallic reinforcing body 32 is integrally formed on the middle segment 311 of the metallic pin 31) is formed without affecting the current conduction property and can effectively improve the mechanical strength of the metallic pin 31. Moreover, when the rectangular probe 3 is inserted into the upper die 1, the spacer, and the lower die 2, the outside diameter D32 jointly formed by the metallic reinforcing body 32 and the middle segment 311 is larger than the second aperture D21, thereby preventing the rectangular probe 3 from falling outside the range of the probe head 10 through the second thru-hole 21.

In order to avoid excessively weakening the current conduction property of the metallic pin 31 or the mechanical strength property of the metallic reinforcing body 32, the metallic pin 31 and the metallic reinforcing body 32 in the present embodiment are further provided with a preferred cooperation and connection, which is disclosed as follows, thereby enabling the rectangular probe 3 to be formed with a better current conduction property and a better mechanical strength property at the same time, but the present disclosure is not limited thereto.

Figure 3B:
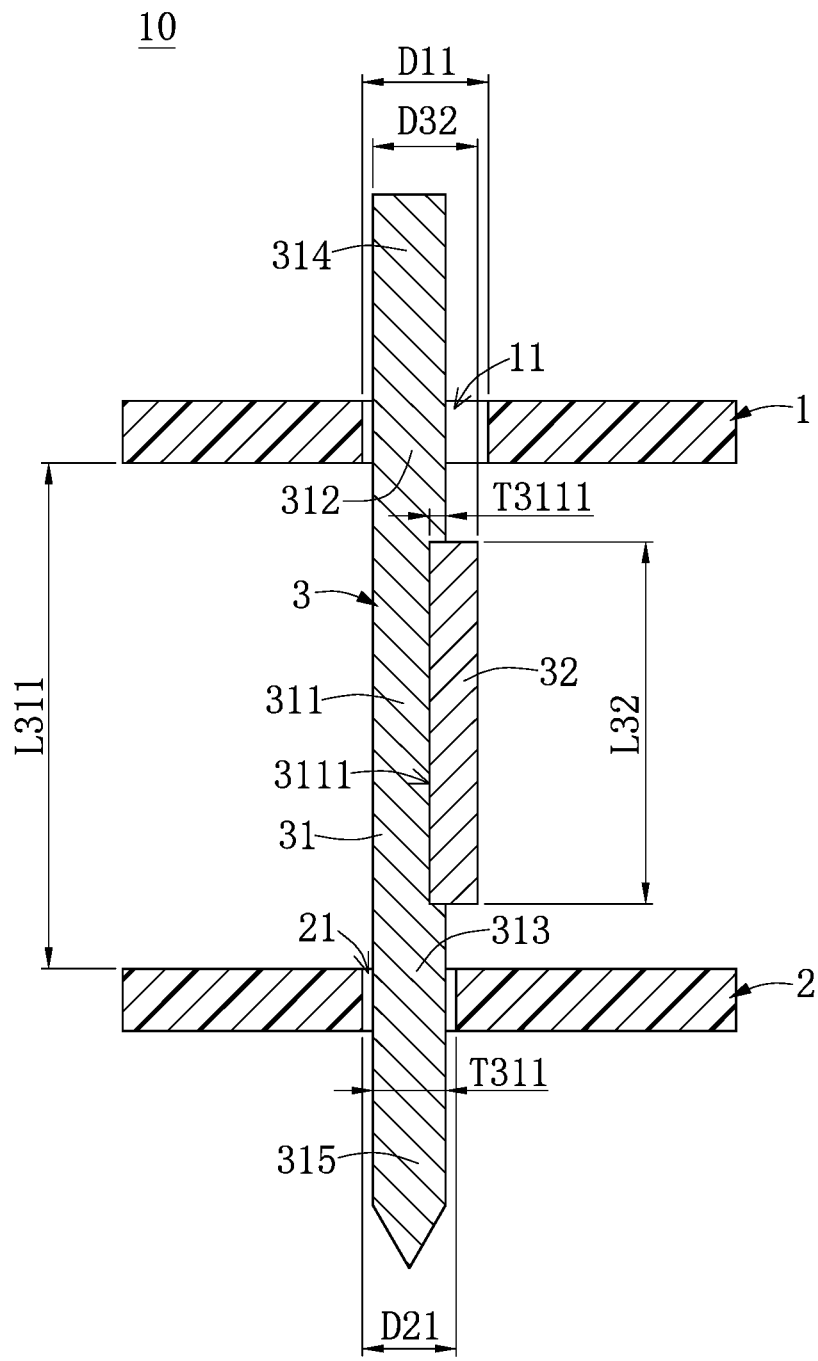
FIG. 3B is a cross-sectional view showing a first variation structure of FIG. 3A.
Figure 3C:
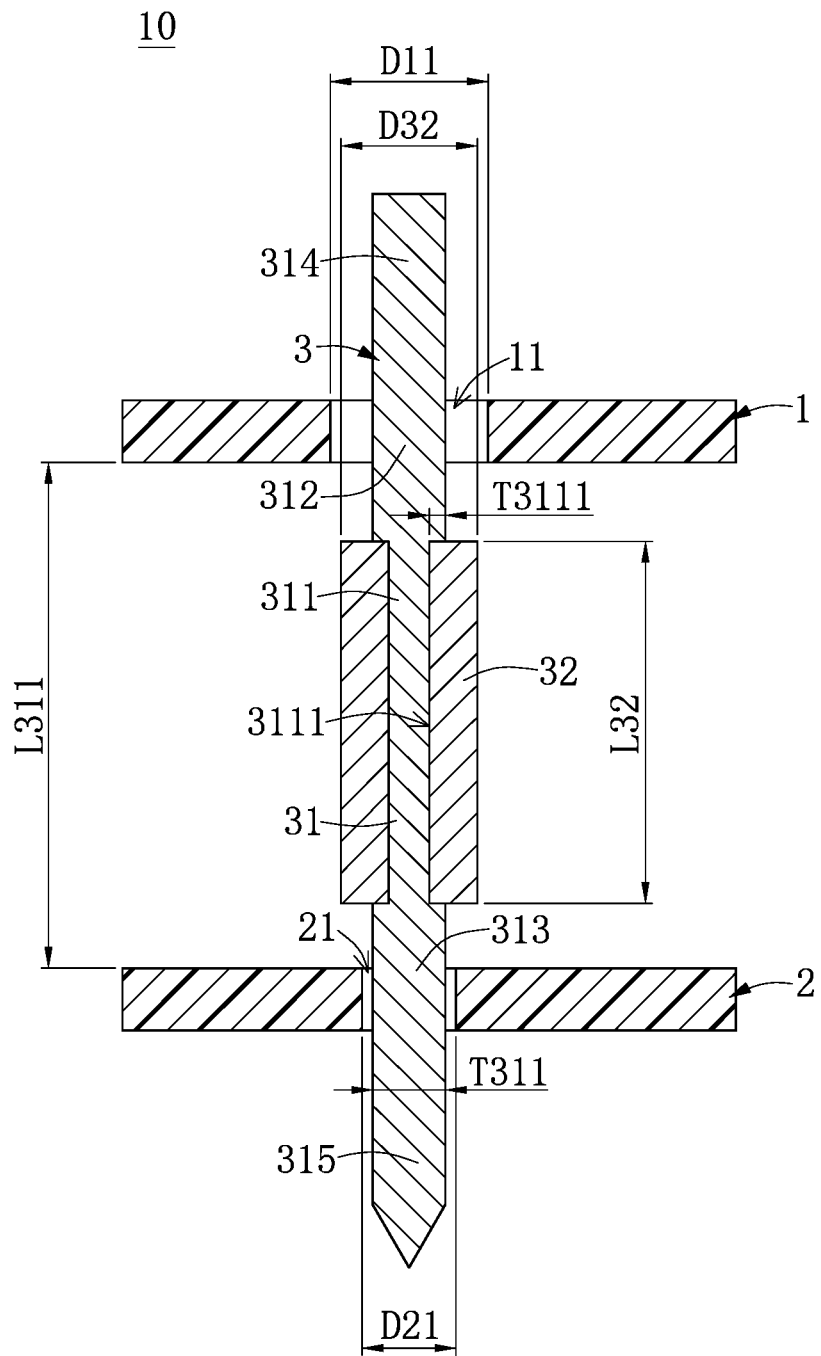
FIG. 3C is a cross-sectional view showing a second variation structure of FIG. 3A.
Figure 3D:
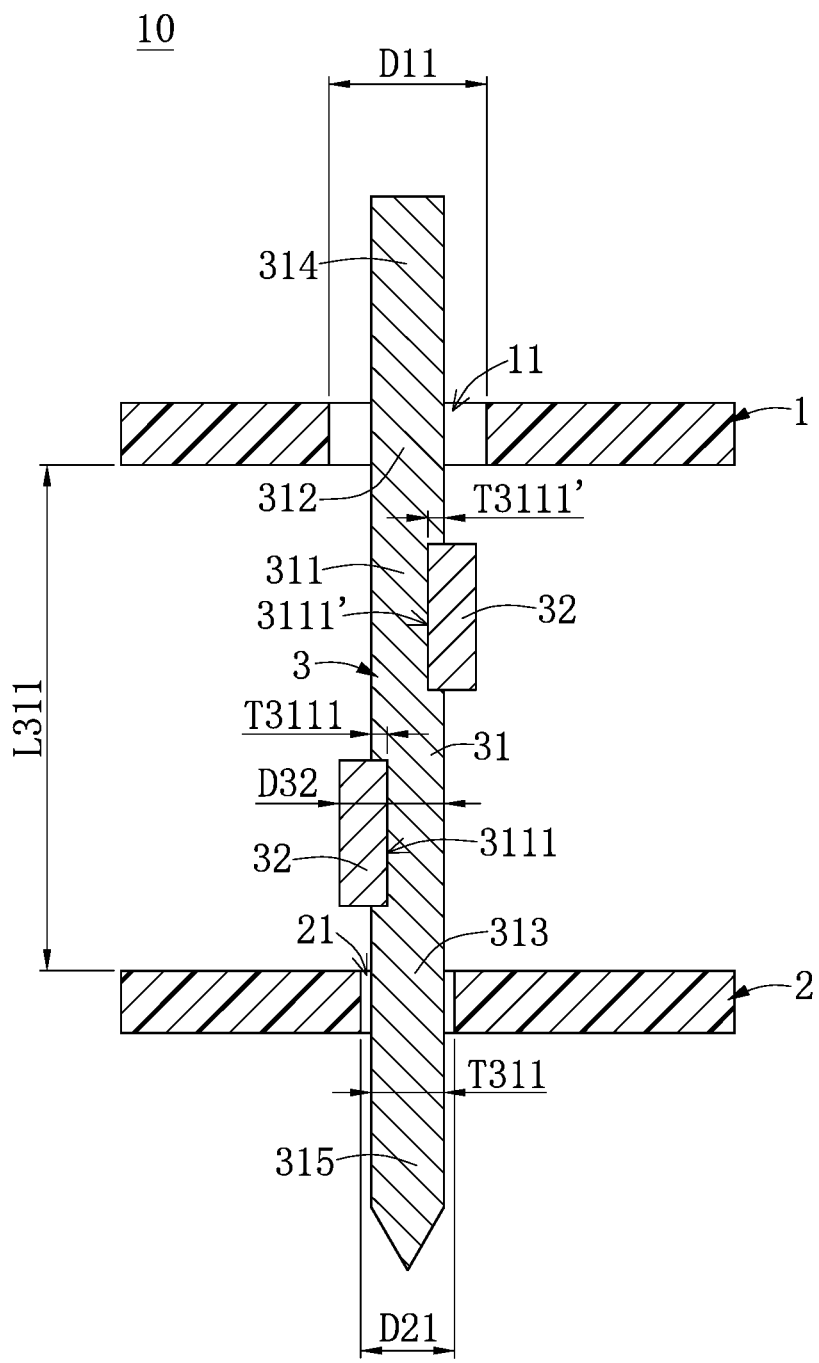
FIG. 3D is a cross-sectional view showing a third variation structure of FIG. 3A.

As shown in FIGS. 3A to 3C, a portion of the middle segment 311 connected to the metallic reinforcing body 32 has a length L32 substantially equal to at least 75% of a length L311 of the middle segment 311, thereby improving the mechanical strength of the metallic pin 31. As shown in FIG. 3D, the number of the metallic reinforcing body 32 can be two, and the two metallic reinforcing bodies 32 are respectively arranged adjacent to the upper die 1 and the lower die 2. As shown in FIGS. 4A to 4D, in a cross section of the middle segment 311 and the metallic reinforcing body 32, which is perpendicular to the longitudinal direction of the rectangular probes 3, at least 50% of an outer surface of the middle segment 311 is covered by the metallic reinforcing body 32.

Figure 4A:
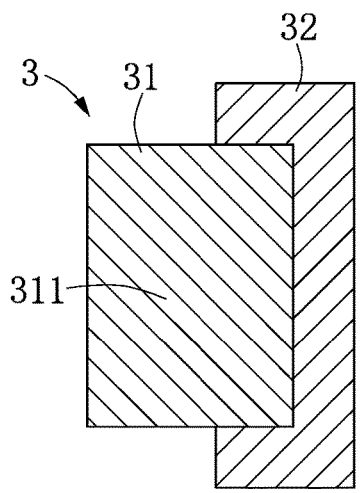
FIG. 4A is a cross-sectional view taken along a cross-sectional line IV-IV of FIG. 2.
Figure 4B:
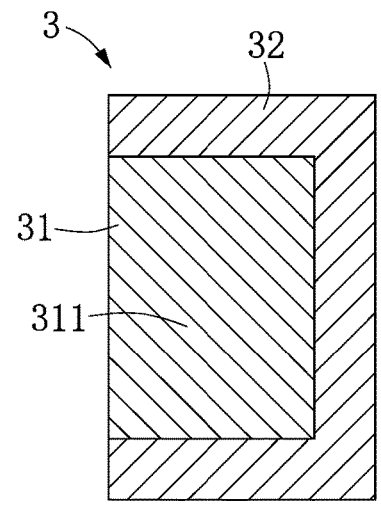
FIG. 4B is a cross-sectional view showing a first variation structure of FIG. 4A.
Figure 4C:
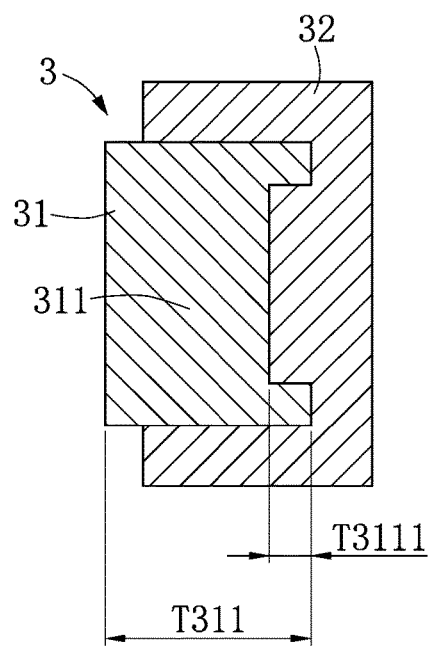
FIG. 4C is a cross-sectional view showing a second variation structure of FIG. 4A.

Moreover, as shown in FIGS. 3B, 3C, and 4C, the middle segment 311 of the metallic pin 31 has a slot 3111, a depth T3111 of the slot 3111 is equal to or smaller than 50% of a maximum thickness T311 of the middle segment 311, thereby preventing the slot 3111 from affecting the current conduction property of the middle segment 311. For example, the middle segment 311 is formed with the single ring-shaped slot 3111 as shown in FIG. 3C, and the minimum thickness of the middle segment 311 is larger than 50% of the maximum thickness T311. In the present embodiment, the metallic reinforcing body 32 is fully filled in the slot 3111 and protrudes from the slot 3111, thereby firmly connecting the middle segment 311 and the metallic reinforcing body 32 by using the concave-convex cooperation structure.

Specifically, in the cross section of the middle segment 311 and the metallic reinforcing body 32, the connecting area of the middle segment 311 and the metallic reinforcing body 32 can be increased by forming the slot 3111, and at least 65% of the outer surface of the middle segment 311 can be covered by the metallic reinforcing body 32 for further improving the mechanical strength of the middle segment 311.

Figure 4D:
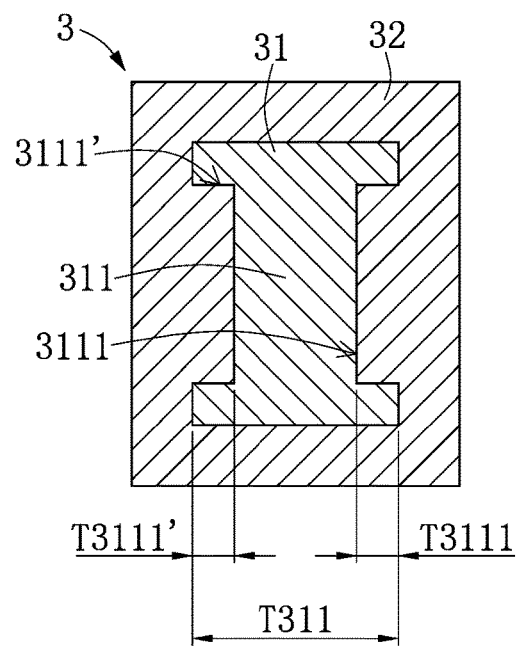
FIG. 4D is a cross-sectional view showing a third variation structure of FIG. 4A.

In addition, the number or the shape of the slot 3111 formed on the middle segment 311 can be changed according to designer demands, and the present disclosure is not limited thereto. For example, as shown in FIG. 4D, the middle segment 311 has two slots 3111, 3111' respectively formed on two opposite sides thereof, and the sum of the thickness T3111 of the slot 3111 and the thickness T3111' of the slot 3111' is equal to or smaller than 50% of the maximum thickness T311 of the middle segment 311, and the metallic reinforcing body 32 is fully filled in the two slots 3111, 3111' and entirely covers a corresponding portion of the outer surface of the middle segment 311.

Besides, the structure of the rectangular probe 3 can be changed according to designer demands. For example, a maximum outside diameter of the first contacting segment 314 can be larger than the first aperture D11 of the upper die 1, thereby preventing the first contacting segment 314 from falling into the first thru-hole 11.

[The Effects of the Above Embodiments]

In summary, the structure of the rectangular probe 3 (i.e., the metallic reinforcing body 32 is integrally formed on the middle segment 311 of the metallic pin 31) is formed without affecting the current conduction property and can effectively improve the mechanical strength of the metallic pin 31.

Moreover, when the rectangular probe 3 is inserted into the upper die 1, the spacer, and the lower die 2, the outside diameter D32 jointly formed by the metallic reinforcing body 32 and the middle segment 311 is larger than the second aperture D21, thereby preventing the rectangular probe 3 from falling outside the range of the probe head 10 through the second thru-hole 21.

In addition, the present embodiment is further provided with a preferred cooperation and connection for enabling the rectangular probe 3 to be formed with a better current conduction property and a better mechanical strength property at the same time. For example, the middle segment 311 of the metallic pin 31 is formed with the slot 3111, and the depth T3111 of the slot 3111 is equal to or smaller than 50% of the maximum thickness T311 of the middle segment 311; the metallic reinforcing body 32 is fully filled in the slot 3111 and protrudes from the slot 3111, and at least 65% of the outer surface of the middle segment 311 can be covered by the metallic reinforcing body 32.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A probe card device, comprising:
an upper die having a plurality of first thru-holes, wherein each of the first thru-holes has a first aperture;
a lower die having a plurality of second thru-holes and substantially parallel to the upper die, wherein the second thru-holes are respectively corresponding in position to the first thru-holes, and each of the second thru-holes has a second aperture smaller than the first aperture; and
a plurality of rectangular probes each including a metallic pin and a metallic reinforcing body integrally formed on the metallic pin, wherein in each of the rectangular probes, a Young's modulus of the metallic reinforcing body is larger than that of the metallic pin, and electric conductivity of the metallic pin is larger than that of the metallic reinforcing body, wherein the metallic pin of each of the rectangular probes includes:
a middle segment arranged between the upper die and the lower die;
a first connecting segment extending from an end of the middle segment and arranged in the corresponding first thru-hole;
a second connecting segment extending from the other end of the middle segment and arranged in the corresponding second thru-hole;
a first contacting segment extending from the first connecting segment and arranged outside the corresponding first thru-hole; and
a second contacting segment extending from the second connecting segment and arranged outside the corresponding second thru-hole;

wherein in each of the rectangular probes, the metallic reinforcing body is integrally formed on the middle segment of the metallic pin, and an outside diameter jointly formed by the metallic reinforcing body and the middle segment is larger than the second aperture and smaller than the first aperture.

2. The probe card device as claimed in claim 1, wherein in each of the rectangular probes, a distance between the metallic reinforcing body and the lower die is equal to or smaller than a distance between the metallic reinforcing body and the upper die.

3. The probe card device as claimed in claim 1, wherein in each of the rectangular probes, a portion of the middle segment connected to the metallic reinforcing body has a length substantially equal to at least 75% of a length of the middle segment.

4. The probe card device as claimed in claim 1, wherein in a cross section of the middle segment and the metallic reinforcing body of each of the rectangular probes, at least 50% of an outer surface of the middle segment is covered by the metallic reinforcing body.

5. The probe card device as claimed in claim 1, further comprising a space transformer abutted against the rectangular probes; wherein in each of the rectangular probes, the first contacting segment has a maximum outside diameter larger than the first aperture, the Young's modulus of the metallic pin is within a range of 40~100 Gpa, the electric conductivity of the metallic pin is larger than or equal to $5.0\times10^{-4}$ S·m$^{-1}$, the Young's modulus of the metallic reinforcing body is larger than or equal to 100 Gpa, and the electric conductivity of the metallic reinforcing body is larger than or equal to $4.6\times10^{-4}$ S·m$^{-1}$.

6. The probe card device as claimed in claim 1, wherein in each of the rectangular probes, the middle segment has a slot, the metallic reinforcing body is fully filled in the slot and protrudes from the slot;
wherein in a cross section of the middle segment and the metallic reinforcing body of each of the rectangular probes, at least 65% of an outer surface of the middle segment is covered by the metallic reinforcing body.

7. The probe card device as claimed in claim 6, wherein in each of the rectangular probes, a depth of the slot is equal to or smaller than 50% of a maximum thickness of the middle segment.

8. A rectangular probe of a probe card device, comprising:
a metallic pin including:
  a middle segment;
  a first connecting segment and a second connecting segment respectively extending from two opposite ends of the middle segment;
  a first contacting segment extending from the first connecting segment in a direction away from the middle segment; and
  a second contacting segment extending from the second connecting segment in a direction away from the middle segment; and
a metallic reinforcing body integrally formed on the middle segment of the metallic pin, wherein a Young's modulus of the metallic reinforcing body is larger than that of the metallic pin, electric conductivity of the metallic pin is larger than that of the metallic reinforcing body, and an outside diameter jointly formed by the metallic reinforcing body and the middle segment is larger than an outside diameter of the second connecting segment.

9. The rectangular probe of the probe card device as claimed in claim 8, wherein a portion of the middle segment connected to the metallic reinforcing body has a length substantially equal to at least 75% of a length of the middle segment, the Young's modulus of the metallic pin is within a range of 40~100 Gpa, the electric conductivity of the metallic pin is larger than or equal to $5.0\times10^{-4}$ S·m$^{-1}$, the Young's modulus of the metallic reinforcing body is larger than or equal to 100 Gpa, and the electric conductivity of the metallic reinforcing body is larger than or equal to $4.6\times10^{-4}$ S·m$^{-1}$.

10. The rectangular probe of the probe card device as claimed in claim 8, wherein the metallic pin is in a straight shape, the middle segment has a slot, a depth of the slot is equal to or smaller than 50% of a maximum thickness of the middle segment, and the metallic reinforcing body is fully filled in the slot and protrudes from the slot; wherein in a cross section of the middle segment and the metallic reinforcing body of each of the rectangular probes, at least 65% of an outer surface of the middle segment is covered by the metallic reinforcing body.

* * * * *